United States Patent [19]

Drummond et al.

[11] Patent Number: 4,804,810
[45] Date of Patent: Feb. 14, 1989

[54] APPARATUS AND METHOD FOR TAPE BONDING

[75] Inventors: Fred Drummond, San Jose, Calif.; James W. Clark, Grants Pass, Oreg.

[73] Assignee: Fairchild Semiconductor Corporation, Cupertino, Calif.

[21] Appl. No.: 170,564

[22] Filed: Mar. 14, 1988

Related U.S. Application Data

[63] Continuation of Ser. No. 876,317, Jun. 19, 1986, abandoned.

[51] Int. Cl.[4] ................................................ B23K 1/12
[52] U.S. Cl. .............................. 219/85 G; 219/85 F; 219/85 M; 228/179
[58] Field of Search ............... 219/85 R, 85 D, 85 F, 219/85 G, 85 M, 233, 235, 243; 228/179, 180.1, 180.2, 264

[56] References Cited

U.S. PATENT DOCUMENTS 4,543,462  9/1985  Rossell ........................... 219/119 X Primary Examiner—Clifford C. Shaw
Attorney, Agent, or Firm—Lee Patch; James M. Heslin; Robert C. Colwell

[57] ABSTRACT

A bonding apparatus for eutectically bonding tape leads to semiconductors and other substrates includes four separate bonding rails for applying heat. The bonding rails have a preselected distribution of mass along their length in order to compensate for uneven heating characteristics which are normally observed in linear heating elements. Usually, four such heat elements are orthogonally arranged at the bottom ends of four electric power buses. By attaching the heating elements to adjacent power buses, and coupling diagonally opposed pairs of the power buses to the positive and negative polarity of a current source, substantially uniform heating of all four elements may be achieved. The ability to provide uniform heating is critical for properly forming eutectic bonds.

12 Claims, 4 Drawing Sheets

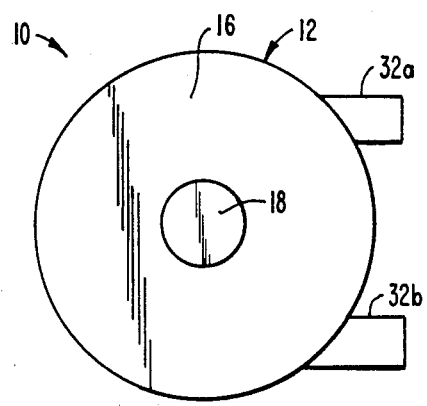
FIG._2.
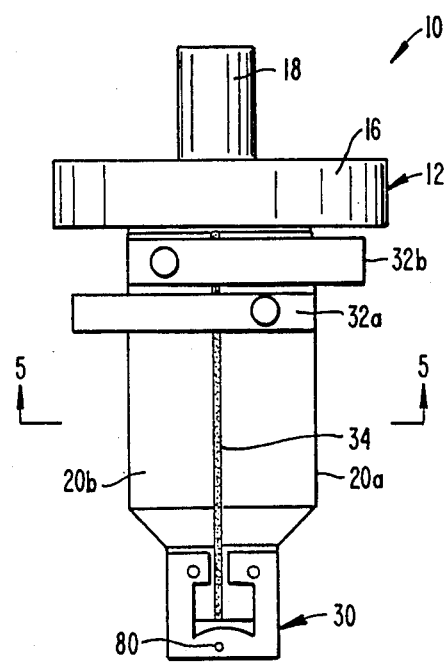
FIG._3.
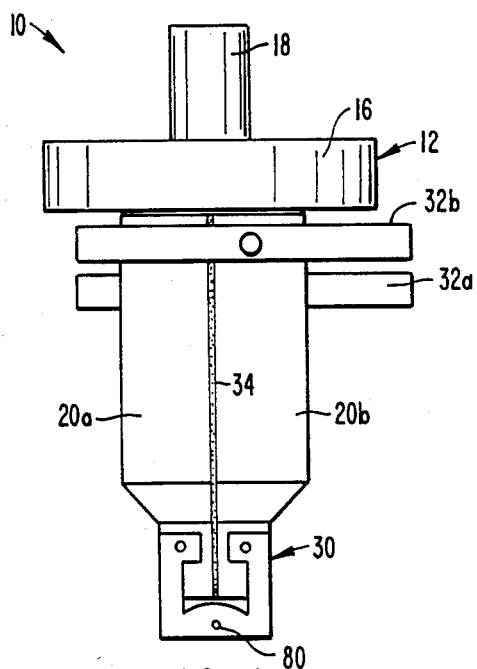
FIG._1.
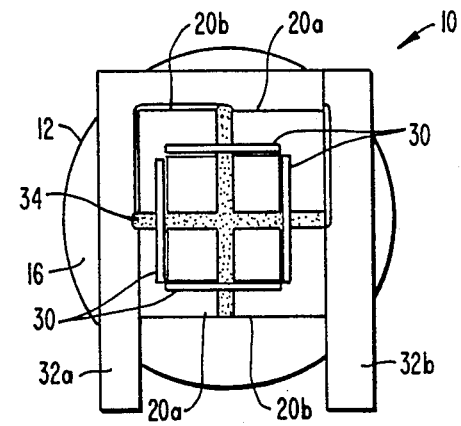
FIG._4.

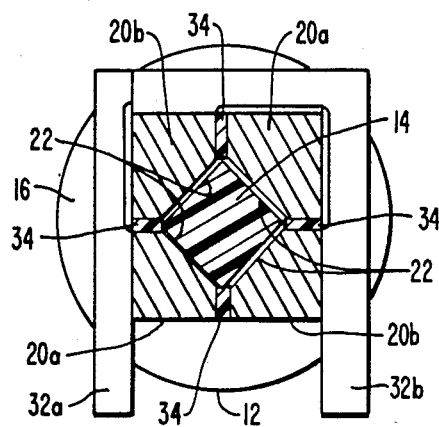
FIG._5.
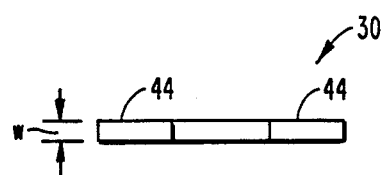
FIG._7B.
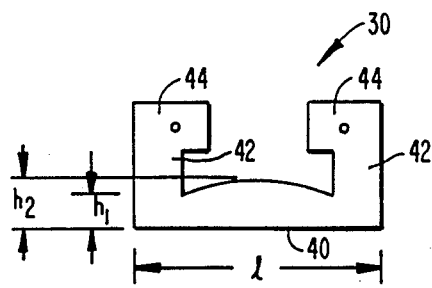
FIG._7A.
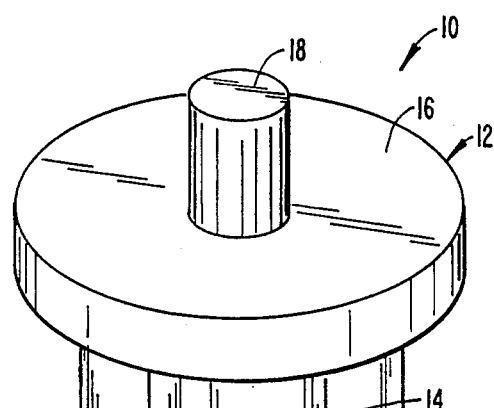
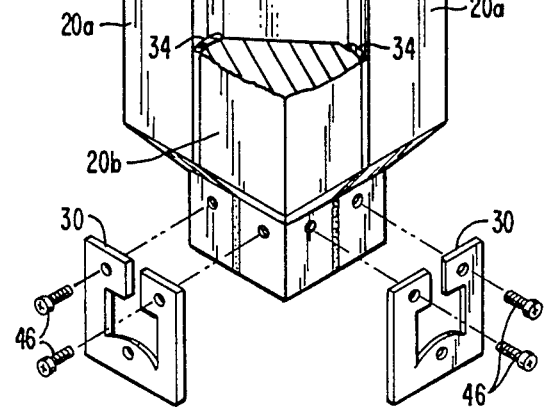
FIG._6.

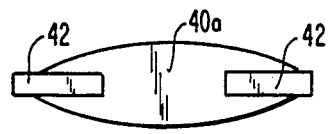
FIG._8B.
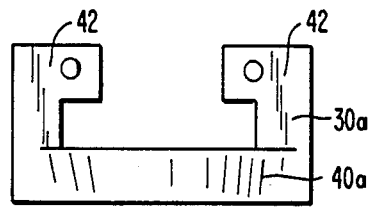
FIG._8A.
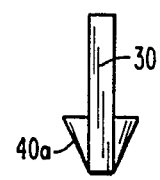
FIG._8C.
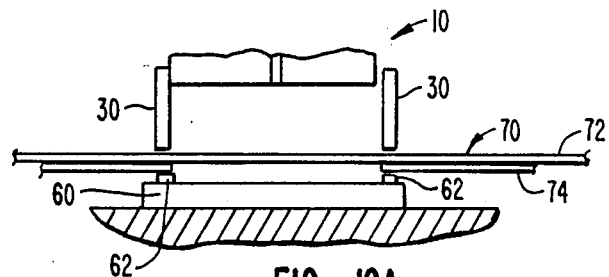
FIG._10A.
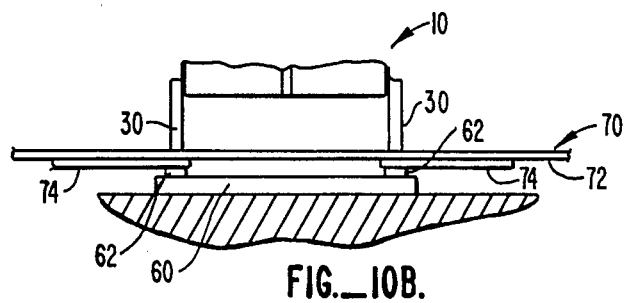
FIG._10B.
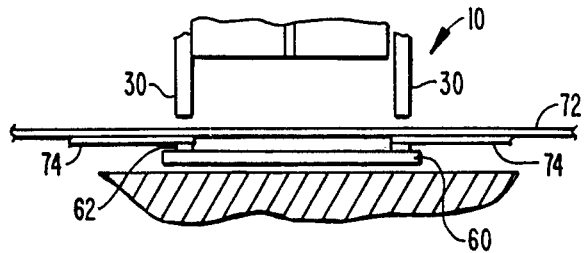
FIG._10C.

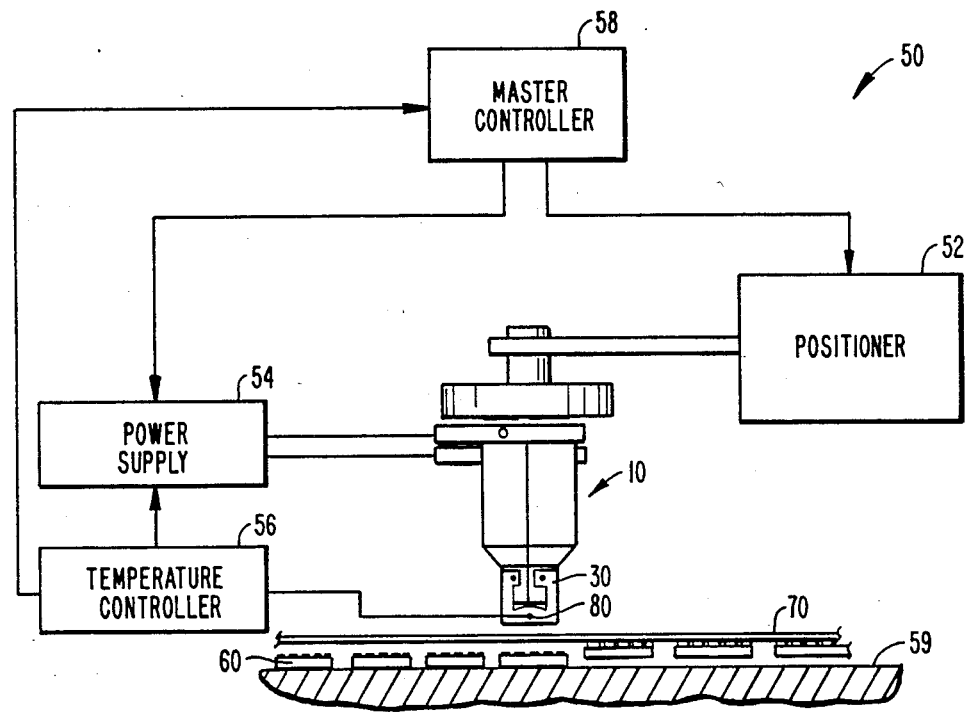
FIG._9.

APPARATUS AND METHOD FOR TAPE BONDING

This is a continuation of application Ser. No. 876,317, filed 6/19/86 June 19, 1986, now abandoned.

BACKGROUND OF THE INVENTION

The present invention relates generally to semiconductor assembly and packaging operations, and more particularly to apparatus and methods for tape automated bonding of semiconductor dies to lead frames and other substrates.

Improperly formed electrical connections are recognized as a dominant cause for failure of semiconductor device packages. Integrated circuit devices may include dozens, or even hundreds, of bonding pads which must be interconnected with other devices, typically by attachment to lead frames or specialized substrates. Such interconnection may be achieved by wire bonding, where small individual wires are bonded at one end to the bonding pad on the device, and at the other end to the lead frame or substrate. Alternatively, and of particular interest to the present invention, tape bonding utilizes gold or tin plated copper leads formed on a plastic tape. The leads are first bonded to the bonding pads on the semiconductor device in a single or "gang" operation. Thereafter, the semiconductor device is carried on the tape to a second location where the outer ends of the leads are bonded to a package lead frame or other substrate, also in a single operation.

Bonding of metal tape can be achieved either by thermocompression of gold-plated tape, reflow of solder-plated tape, or eutectic bonding of tin-plated tape. Of the three techniques, eutectic bonding is often preferred because it provides very reliable, low resistance contacts which are less prone to failure than contacts formed by the other two techniques. Such eutectic bonds, however, are generally more difficult to form and require much better temperature control of the bonding tool. A particular problem has arisen with certain bonding tools which are not evenly heated across the entire contact area. It has been found by the inventors herein that temperature variations on the order of ±10° C. can result in failure to achieve eutectic bonding regardless of adjustments made to the time period of contact.

For these reasons, it would be desirable to provide bonding tools which are specifically designed for forming eutectic bonds between bonding tape leads and metal bonding pads on semiconductor devices. In particular, it would be desirable if such bonding tools were capable of maintaining a precisely controlled temperature along the entire contact area, and which further allow a rapid heat-up and cool-down to allow for short cycling time. Finally, it would be desirable if the bonding tool were easy to manufacture and allowed for very close tolerances such as those found in very large scale integrated (VLSI) circuits where the individual dies have a very large number of closely spaced bonding pads.

SUMMARY OF THE INVENTION

Apparatus and methods for tape bonding of semiconductor devices are provided. In particular, a novel bonding apparatus includes at least two separate linear resistance heating elements mounted on an electrically and thermally insulating frame, typically a plastic core. The linear heating elements are specially formed to provide uniform heating characteristics along their entire length when a current is applied. Specifically, the mass of the heating element is selectively distributed so that the element heats and cools at a uniform rate along its entire length, being substantially free from hot and cold spots. The preferred mass distribution pattern provides for concentration of the mass near the middle of the element. The uniform heating and cooling achieved by such an element has been found to provide for reliable eutectic bonding at all points along the heating elements.

In a preferred embodiment of the present invention, the bonding apparatus includes four electric power buses mounted on an elongate core composed of an electrically and thermally insulating material. The linear heating elements are mounted on adjacent pairs of the buses, typically forming a square pattern corresponding to a desired pattern of inner or outer lead bonds. Diagonally-opposed pairs of the power buses are respectively coupled to positive and negative current sources, providing a particularly compact and efficient manner for supplying the relatively high current required by each of the four separate heating elements.

The bonding apparatus of the present invention provides for highly uniform temperature control of each of the linear heating elements mounted on the frame. Moreover, by mounting the heating elements and power buses on an electrically and thermally insulating frame, the thermal mass of the apparatus is reduced and the ability to rapidly heat and cool the heating elements is enhanced. Such rapid heating and cooling of the elements is necessary to allow rapid cycling of the tool in forming eutectic bonds according to the preferred method of the present invention.

BRIEF DESCRIPTION OF THE DRAWINGS

FIG. 1 is a side elevational view of the bonding apparatus of the present invention.

FIG. 2 is a top view of the bonding apparatus.

FIG. 3 is a front elevational view of the bonding apparatus.

FIG. 4 is a bottom view of the bonding apparatus.

FIG. 5 is a sectional view of the bonding apparatus taken along line 5—5 of FIG. 3.

FIG. 6 is an isometric view of the bonding apparatus with one of four power buses removed and a pair of linear heating elements moved away.

FIGS. 7A and 7B are a side elevational and top view, respectively, of a first embodiment of the linear heating element of the present invention.

FIGS. 8A, 8B, and 8C, are front, top, and side views, respectively, of a second embodiment of the linear heating element of the present invention.

FIG. 9 is a schematic illustration of the bonding system of the present invention.

FIGS. 10A–10C illustrate the steps in the bonding method of the present invention.

DESCRIPTION OF THE PREFERRED EMBODIMENTS

According to the present invention, a bonding apparatus is provided for interconnecting tape leads between semiconductor dies and lead frames or other substrates. The bonding apparatus is suitable for forming both inner lead bonds (ILB), i.e., bonds between one end of the tape lead and the bonding pad on the semiconductor die, and outer lead bonds (OLB), i.e., bonds between the other end of the tape leads and the lead frame or substrate. The bonding apparatus is particularly intended for forming eutectic bonds where an alloy is formed between the material of the bonding pad, typically gold, and a material coated on the tape leads, typically tin. The formation of the gold-tin eutectic requires precise temperature control, and the bonding apparatus of the present invention is able to provide such control simultaneously for all bonds which are being formed. Although particularly intended for eutectic bonding, the present invention is also suitable for forming both conventional solder bonds where solder material coated on the tape is reflowed on the bonding pads and thermocompression bonds.

The present invention will employ conventional bonding tape, typically formed by etching or stamping a desired pattern of copper leads on a plastic, usually polyimide, carrier film. The copper leads are then plated with a coating material, typically tin for eutectic bonding or a tin-lead solder for conventional solder reflow bonding.

Referring now to FIGS. 1–6, a bonding apparatus 10 includes a frame 12 comprising a square core 14 (FIGS. 5 and 6) having a flange 16 and an extension 18. The frame 12 is formed from an electrically and thermally insulating material, typically an organic polymer such as a molded phenolic resin. The frame 12 will typically be molded as an integral unit, although the various pieces could be formed separately and assembled.

Four electric power bus members 20a and 20b are mounted about the periphery of the frame core 14, as best illustrated in FIG. 5. Each of the buses 20a and 20b is generally rectangular, having a square cross-section which is chamfered at one corner. The chamfered face 22 mates against a flat surface of the core 14 so that the power buses 20a and 20b are arranged generally parallel to the axis of the frame 12.

Four linear heating elements 30 are attached to the lower ends of the electric buses 20a and 20b with each element being electrically coupled to two adjacent buses. A first pair of diagonally-opposed buses 20a are electrically coupled to a first L-shaped connector 32a, while the second pair of diagonally-opposed buses 20b are electrically coupled to a second L-shaped connector 32b. The first L-shaped connector 32a is electrically isolated from the second pair of uses 20b and, similarly, the second L-shaped connector 32b is isolated from the first pair of buses 20b. In this way, by connecting the L-shaped connectors 32 to the opposite poles of a power source, substantially identical voltages are applied across the diagonally-opposed electric buses 20a and 20b. Since the heating elements 30 are electrically coupled to adjacent pairs of buses 20a/20b, identical voltages will be applied across each heating element, providing for a desired current flow and heating of the element.

The electric buses 20a and 20b are, of course, electrically isolated from one another by the core 14. Additionally, isolation pads 34 will normally be provided between adjacent buses to further assure isolation.

Referring now to FIGS. 7A and 7B, the linear heating element 30 includes a rail 40 extending between a pair of legs 42. The legs 42 include contact portions 44 which are secured against the lower ends of the buses 20a and 20b, typically by screws 46 (FIG. 6). The legs 42 serve to offset the rail 40 beneath the lower ends of the power buses 20a and 20b. In this way, a circuit is completed between the positive and negative power buses 20a and 20b passing through the legs 42 and rail 40.

The linear heating elements 30 are specially formed to provide for even heating along the entire length l of the rail 40. It is observed that unless the heating elements 30 are properly designed, the central portion of the heating element 40 will tend to heat more rapidly and reach a higher temperature than the portions near the legs 44. In order to compensate for this heating pattern, the mass of the rail 40 is concentrated near the middle. This distribution of the mass has several effects. First, the electrical resistance near the middle is reduced, lessening the amount of heat generated. Second, the area is increased, enhancing the heat dissipation from the central portion of the rail. Finally, the increased mass has a greater thermal lag, tending to increase the time required to heat and to lower the ultimate temperature reached. By properly selecting the mass distribution along the length of the rail 40, a substantially even heating pattern can be achieved for the elements 30. In the preferred embodiment of FIGS. 7A and 7B, the rail 40 has a substantially even width W, with a variable height $h_1$ along its length. The initial height $h_1$ proximate each of the legs 42 increases to a maximum of $h_2$ at the middle of the rail 40. The height ratio $h_2/h_1$ will depend on the length l of the rail 40, but will usually vary between about 1.2 and 1.8, typically being about 1.5.

The exact shape of the heating element 30 is not critical, rather it is important only that the mass be properly distributed along the length in order to compensate for the inherently uneven heating characteristics in the linear heating element. An alternative embodiment for the heating element 30 is illustrated in FIGS. 8A–8C. There, heating element 30a still includes legs 42 attached at either end of a rail 40. Instead of having a variable height, as illustrated in FIGS. 7A–7B, rail 40a has a variable width which increases to a maximum near the center and is a minimum at either end. The exact dimensions of the rail 40a will again depend on the length of the rail and on the anticipated operating temperature range of the heating element 30a.

The heating elements 30 will be formed from various high nickel steels, with 718 Inconel ® being preferred.

Referring now to FIG. 9, the bonding apparatus 10 will be employed in a system 50 including a positioner 52 for supporting and reciprocating the bonding apparatus 10, a power supply 54 for supplying current to the L-shaped connectors 32, a temperature controller 56 for sensing the temperature of the heating elements 30 and adjusting the output of the power supply 54 to control the temperatures at a preselected level, and a master controller 58 for coordinating the actions of the positioner, temperature controller, and power supply. The bonding apparatus 10 is mounted to reciprocate above a conveyor 59 for feeding a continuous series of semiconductor dies 60 synchronously with a bonding tape 70. As illustrated, the system 50 is particularly intended for forming inner lead bonds where the leads on the bonding tape 70 are formed with the bonding pads on the semiconductor dies 60. The system, however, may be easily modified to accommodate the forming of outer lead bonds either to conventional lead frames or to other substrates, as is well known in the art.

Referring now to FIGS. 10A–10C, the method of the present invention will be described in detail. A semiconductor die 60 having a plurality of gold bonding pads 62 formed about its periphery is advanced beneath bonding tape 70. The tape 70 includes a plastic backing film 72 having tin-plated copper leads 74 formed on the lower surface thereof. The die 60 and film 74 advanced to a position beneath the bonding apparatus 10 so that the rows of bonding pads 62 are aligned directly beneath the linear heating elements 30. The inner ends of the leads 74 are also aligned between the heating elements 30 and the bonding pads 62. In the position shown in FIG. 10A, the heating elements are typically at a maintenance temperature of approximately 200° C.

Once all elements in the system have been properly aligned, the heating elements are raised to a desired temperature, typically in the range from 300° C. to 305° C., selected to form the eutectic bond between the tin and gold. The temperature of the bonding elements 30 is sensed by a thermocouple 80 (FIG. 9) which feeds to the temperature controller 56. Once the desired bonding temperature has been reached, the bonding apparatus 10 is lowered by the positioner 52 so that the inner ends of the leads 74 are heated and contacted with the bonding pads 62. After a preselected time period, typically about 2 seconds, the tin and gold are melted to form the eutectic alloy, and the temperature of the heating elements 30 is lowered to the maintenance temperature. Once the elements have cooled, the bonding apparatus 10 is raised, and the semiconductor die 60 is attached to the bonding tape 70, as illustrated in FIG. 10C. The semiconductor die 60 may then be transported on the bonding tape for further processing, which may include the formation of outer lead bonds using the bonding apparatus 10 of the present invention.

Although the foregoing invention has been described in some detail by way of illustration and example for purposes of clarity of understanding, it will be obvious that certain changes and modifications may be practiced within the scope of the appended claims.

What is claimed is:

1. A bonding apparatus comprising:
   an elongate core composed of an electrically and thermally insulating material;
   four electric power buses mounted axially on the core;
   means for feeding a positive current to a first diagonally opposed pair of said buses and a negative current to a second diagonally opposed pair of said buses; and
   four linear resistance heating elements, wherein each of said elements is coupled to a positive and a negative bus and each of said buses is coupled to two elements, said elements each being characterized by a variable cross-section area with an increased area near the middle and diminished area at each end, such variable cross-section area providing substantially even heating along the entire length of each linear resistance element when current is applied.

2. A bonding apparatus as in claim 1, wherein the four power buses are arranged in a square array so that adjacent pairs of buses each form a substantially flat continuous face with electrically isolated positive and negative regions.

3. A bonding apparatus as in claim 2, wherein one resistance heating element is secured to each flat face.

4. A bonding apparatus as in claim 3, wherein the heating elements each include a pair of electrically conductive legs and a heating rail extending between said legs, wherein one of said legs is attached to the positive region and the other leg is attached to the negative region.

5. A bonding apparatus as in claim 2, wherein the means for feeding a positive current and a negative current each include an L-shaped conductor electrically coupled to the buses of the desired polarity but electrically isolated from the buses of the opposite polarity.

6. A bonding apparatus as in claim 1, wherein each of the linear resistance heating elements includes a pair of electrically conductive legs and a heating rail extending between said legs.

7. A system for tape bonding semiconductor dies, said system comprising:
   means for conveying the semiconductor dies along a path;
   means for feeding metal bonding tape proximate the semiconductor dies and metal bonding tape including at least two linear resistance heating elements characterized by a distributed mass selected to provide substantially even heating along the entire length of each linear resistance element when current is applied;
   a power supply for feeding a regulated current to the linear resistance heating elements wherein the heating elements have a variable cross-sectional area with an increased area near the middle and a diminished area at each end;
   a temperature controller for sensing the temperatures of the heating elements and regulating the current thereto; and
   a positioner for reciprocating the bonding apparatus so that the heating elements press the bonding tape against the semiconductor dies.

8. A system as in claim 7, wherein the bonding apparatus includes four heating elements.

9. A system as in claim 7, wherein the heating elements are composed of high nickel steel.

10. A method for tape bonding semiconductor dies, said method comprising:
    transporting a plurality of semiconductor dies along a path;
    feeding metal bonding tape proximate to the semiconductor dies;
    pressing the tape onto the dies with a bonding apparatus including at least two linear resistance elements characterized by a distributed mass selected to provide substantially even heating along the entire length of each linear resistance element when current is provided;
    providing a current to the bonding apparatus selected to heat the heating elements to a first temperature selected to effect bonding prior to pressing the tape with the bonding apparatus; and
    stopping the current to the bonding apparatus and allowing the heating elements to cool to a second temperature prior to removing the bonding apparatus from the tape.

11. A method as in claim 10 wherein the first temperature is sufficient to effect eutectic bonding of the metal bonding tape to metal bonding pads on the semiconductor die.

12. A method as in claim 11, wherein the metal tape is tin-plated copper, the bonding pads ar gold, and the first temperature is in the range from about 300° C. to 305° C.

* * * * *